(12) United States Patent
Piesinger

(10) Patent No.: US 9,046,558 B2
(45) Date of Patent: Jun. 2, 2015

(54) APPARATUS AND METHOD FOR DETERMINING THE STATUS AND PHASE OF AN ELECTRIC POWER CABLE

(71) Applicant: Gregory Hubert Piesinger, Cave Creek, AZ (US)

(72) Inventor: Gregory Hubert Piesinger, Cave Creek, AZ (US)

( * ) Notice: Subject to any disclaimer, the term of this patent is extended or adjusted under 35 U.S.C. 154(b) by 0 days.

(21) Appl. No.: 14/526,062

(22) Filed: Oct. 28, 2014

(65) Prior Publication Data

US 2015/0123674 A1     May 7, 2015

Related U.S. Application Data

(60) Provisional application No. 61/900,023, filed on Nov. 5, 2013.

(51) Int. Cl.
| | |
|---|---|
| *G01R 1/00* | (2006.01) |
| *G01R 31/02* | (2006.01) |
| *G01R 19/155* | (2006.01) |
| *G01R 19/165* | (2006.01) |
| *G01R 27/02* | (2006.01) |
| *G01R 1/067* | (2006.01) |

(52) U.S. Cl.
CPC ............ *G01R 31/021* (2013.01); *G01R 19/155* (2013.01); *G01R 19/16533* (2013.01); *G01R 27/02* (2013.01); *G01R 1/0675* (2013.01)

(58) Field of Classification Search
CPC .. G01R 19/145; G01R 31/021; G01R 31/025; G01R 31/086; G01R 19/16561; G01R 1/06788
USPC ............................... 324/539–544, 72.5, 76.11
See application file for complete search history.

(56) References Cited

U.S. PATENT DOCUMENTS

| | | | |
|---|---|---|---|
| 5,672,964 A * | 9/1997 | Vinci ........................... | 324/72.5 |
| 8,390,302 B2 * | 3/2013 | Mousavi et al. .............. | 324/539 |

\* cited by examiner

*Primary Examiner* — Vincent Q Nguyen

(57) ABSTRACT

A probe uses a small diameter insulated needle to accurately penetrate the jacket and thin outer semiconductor sheath of URD cable so as to capacitive couple to the high voltage center conductor and determine its energized status (live or dead) and phase attribute. A precision needle depth gauge, mechanical hard stop, and digital display ensures that the needle does not penetrate the thick center conductor insulation material and provides an indication of the center conductor voltage. The probe can be combined with either internal or external phase identification circuitry to determine the phase attribute of the URD cable.

16 Claims, 8 Drawing Sheets

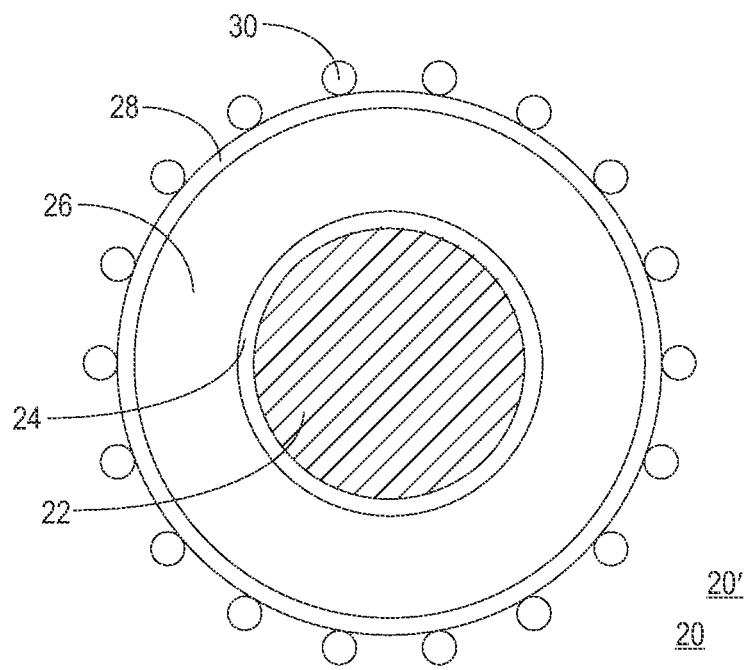
PRIOR ART  FIG. 1
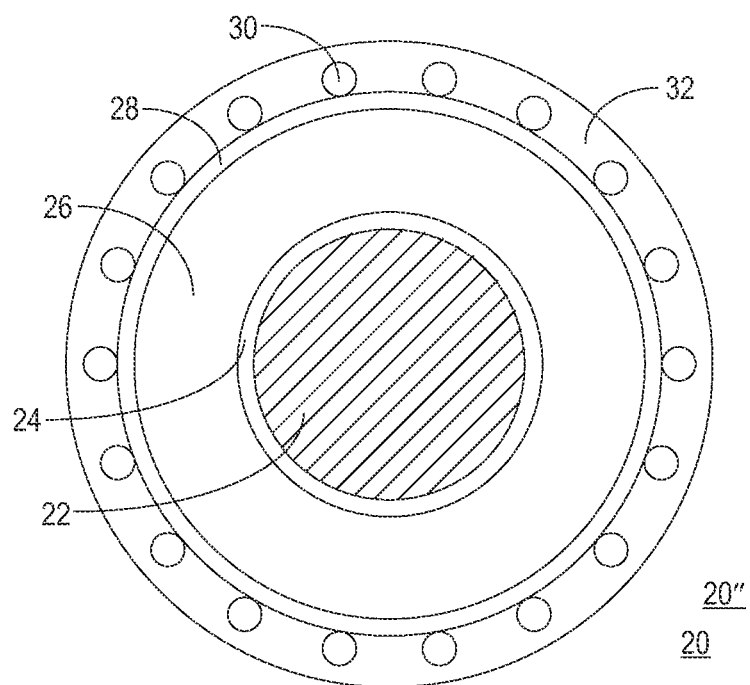
PRIOR ART  FIG. 2

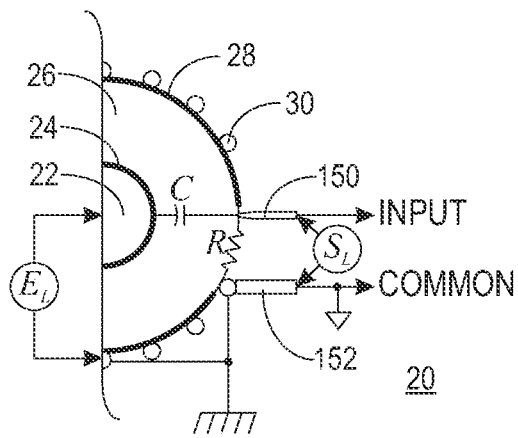
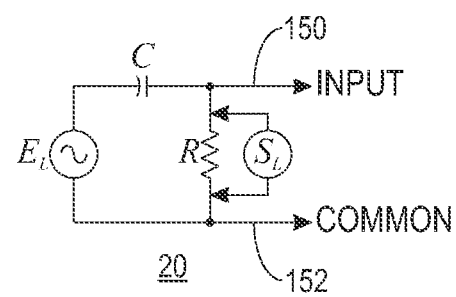
FIG. 3
(Prior Art)
FIG. 4
(Prior Art)
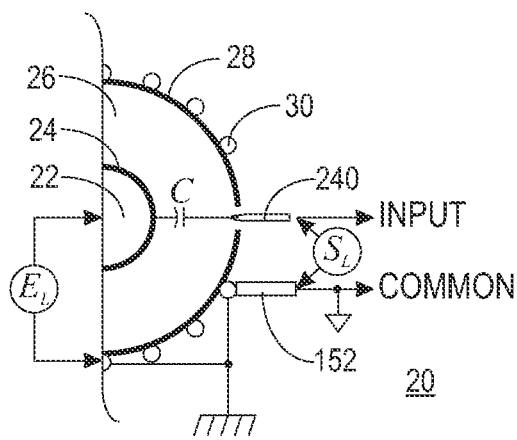
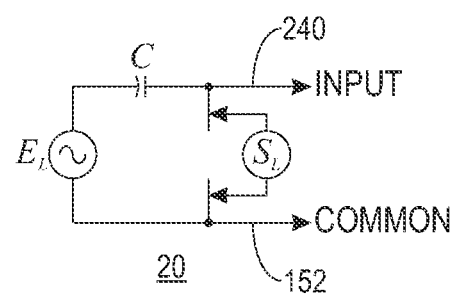
FIG. 6
FIG. 7

APPARATUS AND METHOD FOR DETERMINING THE STATUS AND PHASE OF AN ELECTRIC POWER CABLE

RELATED INVENTION

The present invention claims priority under 35 U.S.C. §119 (e) to: "Apparatus and Method for Determining the Status and Phase of an Electric Power Cable" Provisional U.S. Patent Application Ser. No. 60/900,023, filed 5 Nov. 2013 which is incorporated by reference herein.

TECHNICAL FIELD OF THE INVENTION

The present invention relates to the field of electric power distribution networks. More specifically, the present invention relates to determining the energized status and phase of underground residential distribution power cables.

BACKGROUND OF THE INVENTION

Electric power distribution networks are used by the electric utilities to deliver electricity from generating plants to customers. Although the actual distribution voltages will vary from utility to utility, in a typical network, three-phase power at high voltage (345,000 volts phase-to-phase) is delivered to multiple transmission substations at which transformers step this high voltage down to a lower three-phase voltage (69,000 volts phase-to-phase). This 69,000-volt three-phase power then feeds multiple distribution substations whose transformers further step down the voltage to the distribution voltage (12,470 volts phase-to-phase) and separate the power into three single-phase feeder cables. Typically, these feeder cables operate at 7,200 volts phase-to-ground. Each of these feeder cables branch into multiple circuits to power a plurality of local pole-mounted or pad-mounted transformers which step the voltage down to a final voltage of 120/240 volts for delivery to commercial and residential customers.

In many cases, the final 7,200-volt distribution network utilizes underground (i.e., buried) cables. These cables are typically known as Underground Residential Distribution (URD) cables. Typical URD cables are shown in FIGS. 1 and 2.

In a typical URD cable 20, a center conductor 22 is surrounded by an inner semiconductor sheath 24. Inner semiconductor sheath 24 serves to relieve electrical stress by spreading out and making the electric field more uniform.

Inner semiconductor sheath 24 is surrounded by an insulator 26. Insulator 26 has significant high-voltage insulating properties to minimize the overall size of URD cable 20. Typically, insulator 26 is formed of a polymeric material, such as polyethylene.

Surrounding insulator 26 is an outer semiconductor sheath 28. Like inner sheath 24, outer sheath 28 serves to relieve electrical stress by making the electric field more uniform. Making the electric field more uniform protects insulator 26, which would otherwise be more likely to break down.

Outer semiconductor sheath 28 is surrounded by a shield formed of a plurality of neutral conductors 30. Neutral conductors 30 together serve as a return line for center conductor 22. In a typical three-phase system, neutral conductors 30 carry current resulting from any imbalance among the three phases. In a mechanical sense, neutral conductors 30 form a barrier to protect URD cable 20 from casual penetration (as with a blunt shovel). In the event of a catastrophic penetration through neutral conductors 30 and into or through center conductor 22, neutral conductors 30 serve to provide a short electrical path and thereby offer some protection to a worker wielding the penetrating object.

Semiconductor layers 24 and 28 prevent high stress electric field lines from forming under each neutral conductor 30. But as a side effect, semiconductor layers 24 and 28 also impede detection of the electrical field from outside of layer 28.

URD cable 20 may be an unjacketed URD cable 20' (FIG. 1). In unjacketed URD cable 20', neutral conductors 30 form the outermost layer of the cable. Neutral conductors 30 are therefore in contact with the Earth when unjacketed URD cable 20' is buried.

URD cable 20 may also be a jacketed URD cable 20". In jacketed URD cable 20", neutral conductors 30 are surrounded by and embedded within an insulating jacket 32. Whether URD cable 20 is jacketed or unjacketed, neutral conductors 30 need not be grounded, but usually are grounded at the ends.

As new customers are added, URD cable 20 is cut and an extension cable is spliced in to supply power to the new customer's transformer. This poses certain problems.

One problem is that there are often multiple URD cables 20 in a given trench, conduit, or raceway. Typically, one of these URD cables 20 is de-activated prior to splicing. A problem exists in determining which of these multiple URD cables 20 is de-energized (i.e., "dead").

Clamp-on ammeters are occasionally used in an attempt to determine if a URD cable 20 is dead. Since each URD cable 20 carries its own return, the ammeter is used to measure differential current. But a reading of zero current may result from two very different conditions. Either the cable is in-fact a dead cable, or the cable is live but nearly perfectly balanced (outgoing current on center conductor 22 is equal to return current on neutral conductors 30). Since one of the goals of electrical distribution is to achieve perfect balance, the value of the test becomes more meaningless as this goal is more closely achieved. Consequently, many live cables are misdiagnosed as being dead.

Another related problem is that, in a given dig, extraneous unmapped URD cables 20 may be present. These extraneous URD cables 20 may or may not be energized, and will often confuse ammeter measurements to the point where it is impossible to determine which of the URD cables 20 is the de-energized URD cable 20 to be cut and spliced.

When a URD cable 20 is to be cut and spliced, it is first spiked. That is, a "spike" is driven through the selected URD cable 20 to short neutral conductors 30 to center conductor 22. If the spiked URD cable 20 is live, then spiking will create a short circuit and trip the appropriate circuit breakers. This assures that the worker will not cut into a live URD cable 20.

The spiking of a live URD cable 20 is undesirable for several reasons. First, spiking a live URD cable 20 poses a risk to the worker, albeit a risk significantly less than the cutting of a live URD cable 20. Second, tripping the circuit breaker causes an unnecessary power outage to all customers served by that URD cable 20. Third, unnecessarily spiking a URD cable 20 necessitates a repair of that URD cable 20. Spiking a live URD cable 20, therefore, is dangerous, costly, and time consuming.

Various apparatus have been developed to identify the status, energized or de-energized (live or dead), of URD cables 20. All of these apparatuses suffer from one or more deficiencies. When attempting to use such apparatuses to identify the status of a given URD cable 20, there are four primary conditions:

True-dead—identifying a given URD cable 20 as dead when it is in fact dead;

False-dead—identifying a given URD cable 20 as dead when it is in fact live;

True-live—identifying a given URD cable 20 as live when it is in fact live; and

False-live—identifying a given URD cable 20 as live when it is in fact dead.

A false-live result may cause the worker to backtrack and double-check the removal of power from the desired URD cable 20, may cause additional and unnecessary excavation, and may cause further labor and paperwork. This may result in a waste of time and resources. But a false-dead result, on the other hand, may lead to misidentification of the specific URD cable. 20 to be cut and spliced. This is the worst possible scenario, in that the worker would then spike a live URD cable 20, believing it to be dead. As previously mentioned, spiking a live URD cable 20 is dangerous, costly, and time-consuming.

The only good status results are true-live and true-dead. Only such results will properly identify the specific URD cable 20 to be spiked, cut, and spliced, thereby safely, inexpensively, and efficiently allowing the work to proceed.

Apparatuses intended to determine status almost invariably test to determine if a URD cable 20 is live. No active test is performed to determine if URD cable 20 is dead. The presumption is, of course, that if URD cable 20 is not live, it is dead. This is a dangerous presumption.

If such an apparatus determines a URD cable 20 is live, it is often correct. That is, such an apparatus produces a reasonably reliable true-live result, with few false-live results. On the other hand, such an apparatus does not positively determine if URD cable 20 is dead. The apparatus can therefore only determine if URD cable 20 is "not-live". URD cable 20 may test not-live if it is dead, or if it is live and the test fails for whatever reason, including worker error. This form of test therefore exhibits a high incidence of false-dead results. This is the worst possible scenario, in that the worker would then spike a live URD cable 20, believing it to be dead.

Another problem with many apparatuses for determining the status of URD cables 20 is that they are cumbersome to use. Often, an apparatus (or a portion of the apparatus) must be clamped to the URD cable 20 under test. This requires the worker to get down into a trench or otherwise obtain direct access to and manipulate URD cable 20.

Many such apparatuses are usable only with unjacketed URD cables 20'. Unjacketed URD cables 20' suffer from corrosion and other factors that shorten their useful lifetimes. For this reason, the cable of choice for newer installations is almost invariably jacketed URD cable 20". In order to use an apparatus designed for unjacketed URD cable 20' with a jacketed URD cable 20", a portion of the insulating jacket 32 must be cut away, drilled, or otherwise penetrated. This, too, requires that the worker obtains direct access to and manipulates URD cable 20.

Because the URD cables 20 may carry high voltage (typically 7,200 volts), any procedure requiring direct manipulation of the cable is inherently dangerous. A faulty or misidentified cable may expose the worker to high voltage, and potentially precipitate injury or death. Additionally, all procedures requiring direct manipulation of the cable are cumbersome, costly, and time-consuming. This is especially true for a jacketed URD cable 20" being tested with an apparatus intended for an unjacketed URD cable 20'. When a portion of the insulating jacket 32 has been cut away and that URD cable 20 is determined to not be the URD cable 20 to be cut and spliced, then that URD cable 20 must then be repaired to protect it from corrosion and other factors that would otherwise shorten its useful lifetime. This repair is itself cumbersome, costly, and time-consuming.

Cumbersome and time-consuming procedures often inspire workers to shortcut the testing procedure. This may lead to injury or death, as well as expensive and time-consuming error.

Determining the status of a URD cable 20 by detecting the presence of an electric field in or around a live URD cable 20 is not possible since outer semiconductor sheath 28 completely shields the electric field.

Also, currently no apparatus exists to determine the phase attribute of URD cable in a trench.

SUMMARY OF THE INVENTION

Accordingly, it is an advantage of the present invention that an apparatus is provided for determining the status of URD cable.

It is another advantage of the present invention that an apparatus is provided that actively tests a URD cable for both a live and a dead status.

It is another advantage of the present invention that an apparatus is provided that determines the status of a URD cable while the worker is safely at a distance from the URD cable.

It is another advantage of the present invention that an apparatus is provided that communicates status to the operator using displays viewable at a distance.

It is another advantage of the present invention that an apparatus is provided that determines the status of a URD cable in an easy and straightforward manner.

It is another advantage of the present invention that an apparatus can be used to determine the phase attribute of a URD cable.

The above and other advantages of the present invention are carried out by an apparatus for determining the status of a URD cable in an electric power network operating at line frequency which is 60 Hertz in the United States (US) and 50 Hertz in many locations outside the US.

The apparatus of the current invention uses a fine (small diameter) insulated needle to accurately penetrate the thin semiconductor sheath 28 without entering the thick cable insulation 26. This allows the needle tip to capacitively couple to the center conductor 22 electric field so as to determine voltage status and measure the approximate conductor voltage. The apparatus also indicates if the needle happens to contact one of the neutral conductors 30. If so, the worker simply moves the apparatus a fraction of an inch to a new position and tries again.

The apparatus also includes either internal phase identification circuitry or an interface to external phase identification equipment.

The apparatus includes a cable analysis circuit coupled to the needle. A status display is coupled to the cable analysis circuit and configured to indicate the energized status, approximate voltage, and optionally the phase of the URD cable.

BRIEF DESCRIPTION OF THE DRAWINGS

FIG. 1 illustrates a typical unjacketed URD cable.

FIG. 2 illustrates a typical jacketed URD cable.

FIG. 3 illustrates a schematic view of prior art probing of URD cable.

FIG. 4 illustrates an equivalent circuit of the probing of URD cable in FIG. 3.

FIG. 6 illustrates a schematic view of the present invention's method of probing the URD cable.

FIG. 7 illustrates an equivalent circuit of the present invention's method of probing the URD cable.

DETAILED DESCRIPTION OF THE PREFERRED EMBODIMENTS

Figure 5:
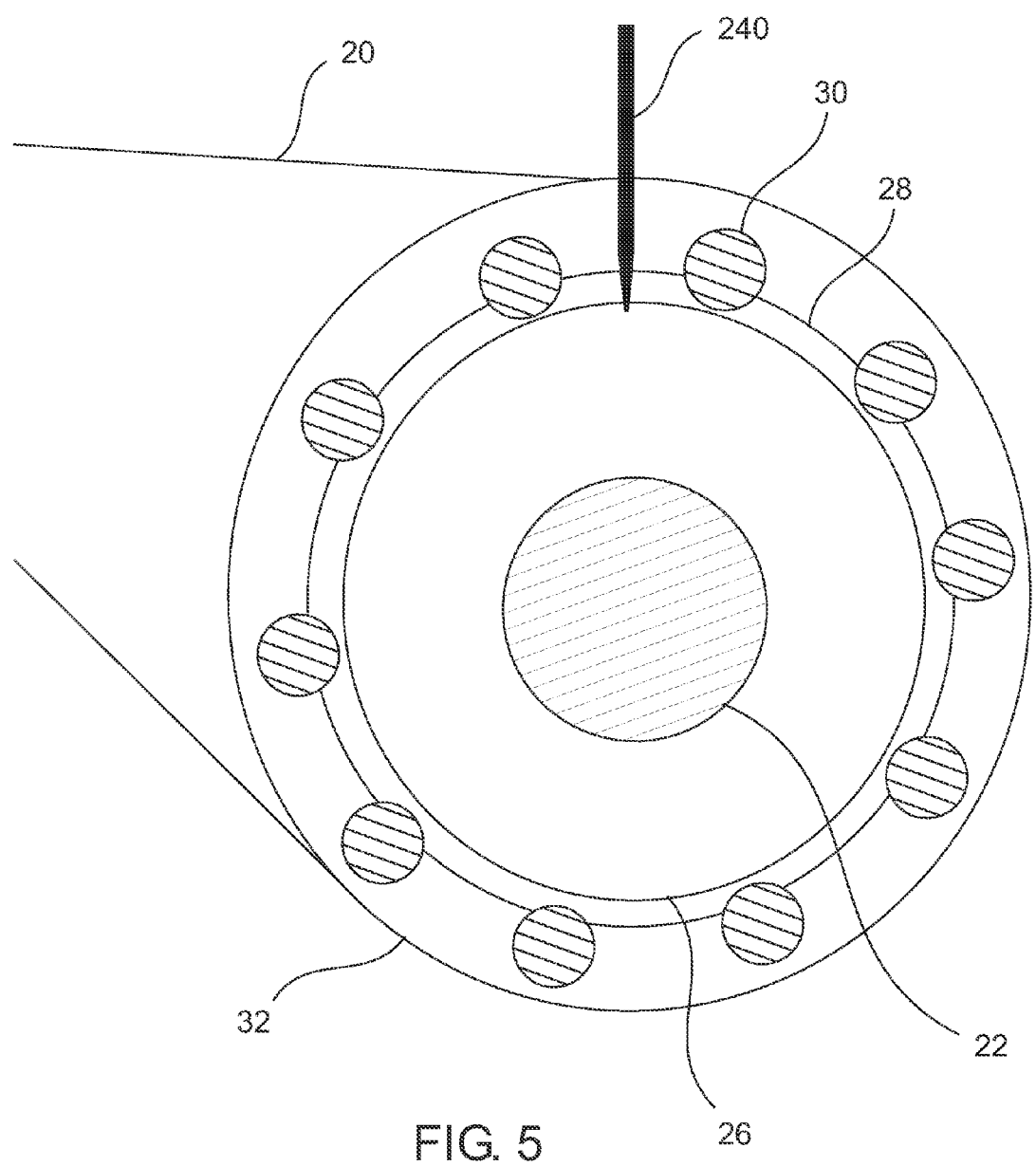
FIG. 5 illustrates the present invention method of overcoming the problems of probing the URD cable illustrated in FIG. 3.

Commonly owned U.S. Pat. No. 7,154,281 issued Dec. 26, 2006, which describes an apparatus and method for determining the status of an electric cable and U.S. Pat. No. 7,031,859 issued Apr. 18, 2006, which describes a phase identification system are incorporated herein by reference.

FIGS. 1 and 2 show cross-sectional views of typical underground residential distribution (URD) cables 20, with FIG. 1 showing an unjacketed URD cable 20' and FIG. 2 a jacketed URD cable 20".

U.S. Pat. No. 7,154,281 describes how the energized status of URD cable 20 can be determined using FIGS. 3 and 4 which show schematic views of the electrical characteristics of URD cable 20 and an equivalent circuit of URD cable 20, respectively as follows.

URD cable 20 has a center conductor 22. When URD cable 20 is live, center conductor 22 carries current at a high voltage $E_L$ (typically 7,200 volts). This current is coupled through a cable capacitance C to outer semiconductor sheath 28. A portion of this current therefore passes through a cable resistance R to form a line signal $S_L$. Line signal $S_L$ has a line-signal amplitude that is normally either very small, on the order of a few millivolts (when URD cable 20 is live) or nearly zero (when URD cable 20 is dead). Naturally, line signal $S_L$ is at line frequency (normally 50-60 Hz). Line signal $S_L$ forms across cable resistance R. Line signal $S_L$ is therefore present across input contact 150 and common (ground) contact 152.

In U.S. Pat. No. 7,154,281, the energized status of URD cable 20 is determined by measuring line signal $S_L$ across cable resistance R. This basic technique is also used by all the references listed in U.S. Pat. No. 7,154,281. Unfortunately, this basic technique is unreliable because line signal $S_L$ across cable resistance R is totally dependent on the resistance of outer semiconductor sheath 28 which varies widely between different cable manufacturers. In some cables, line signal $S_L$ across cable resistance R is zero even when URD cable 20 is energized. This results in a high incidence of false-dead results, which is the worst possible scenario, in that the worker would then spike a live URD cable 20, believing it to be dead. The present invention overcomes this problem as illustrated in FIG. 5.

The apparatus of the current invention uses a fine insulated needle to accurately penetrate through the thin outer semiconductor sheath 28 without entering the thick cable insulation 26 by more than a few thousands of an inch (mils). This allows the needle tip to capacitively couple to center conductor 22 electric field so as to determine voltage status and measure the approximate center conductor 22 voltage. This eliminates false-dead results as center conductor 22 electric field is measured directly irrespective of the resistance of outer semiconductor sheath 28.

Being insulated from and penetrating through outer semiconductor sheath 28 converts FIGS. 3 and 4 to FIGS. 6 and 7 respectively. In FIG. 6, needle 240 does not see resistance R of FIG. 3 because it is insulated from outer semiconductor sheath 28. In FIG. 7, line signal $S_L$ between needle 240 and ground 152 is open circuit and is not influenced by resistance R of outer semiconductor sheath 28.

Figure 8:
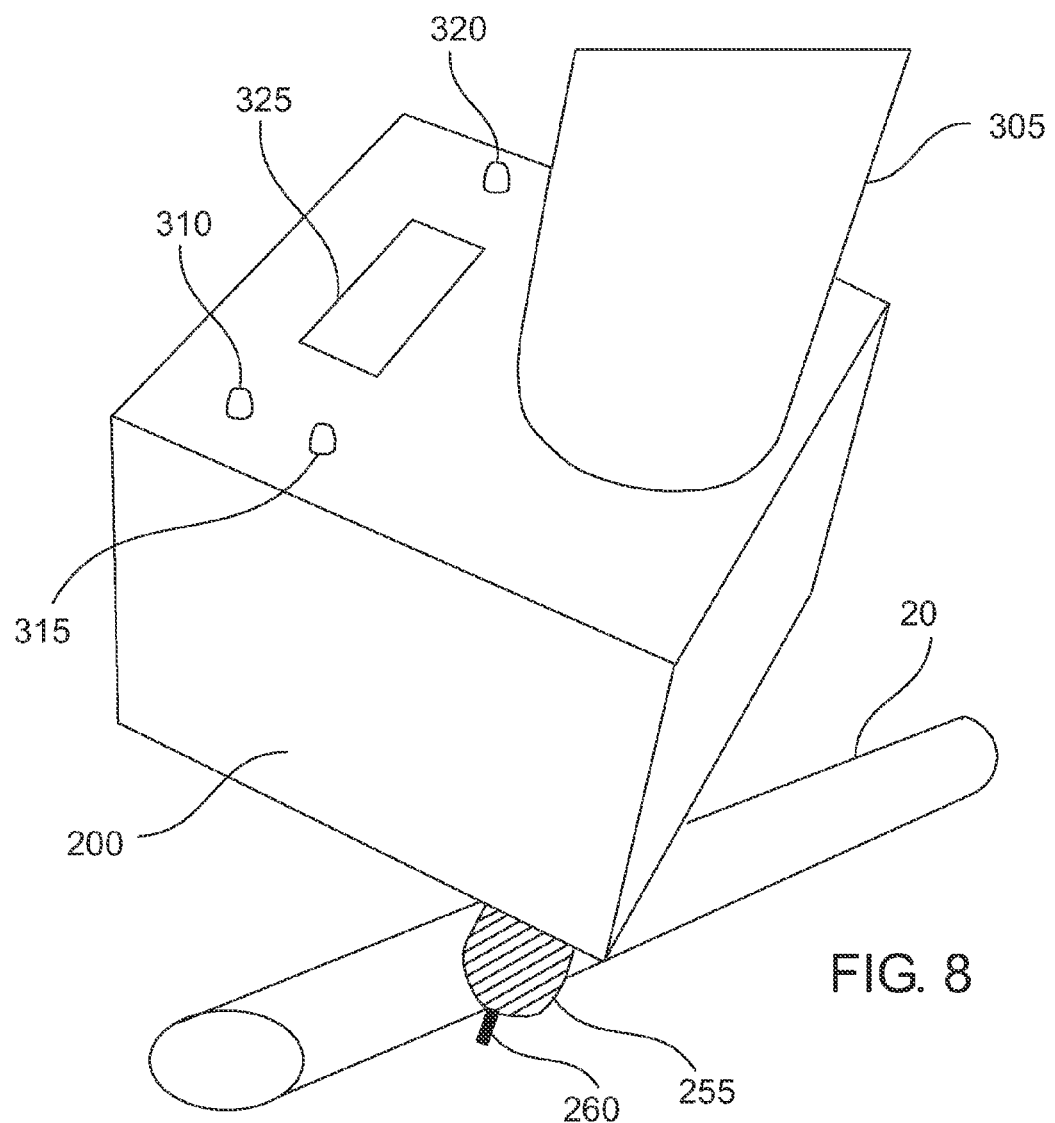
FIG. 8 illustrates a perspective view of the URD probe.
Figure 9:
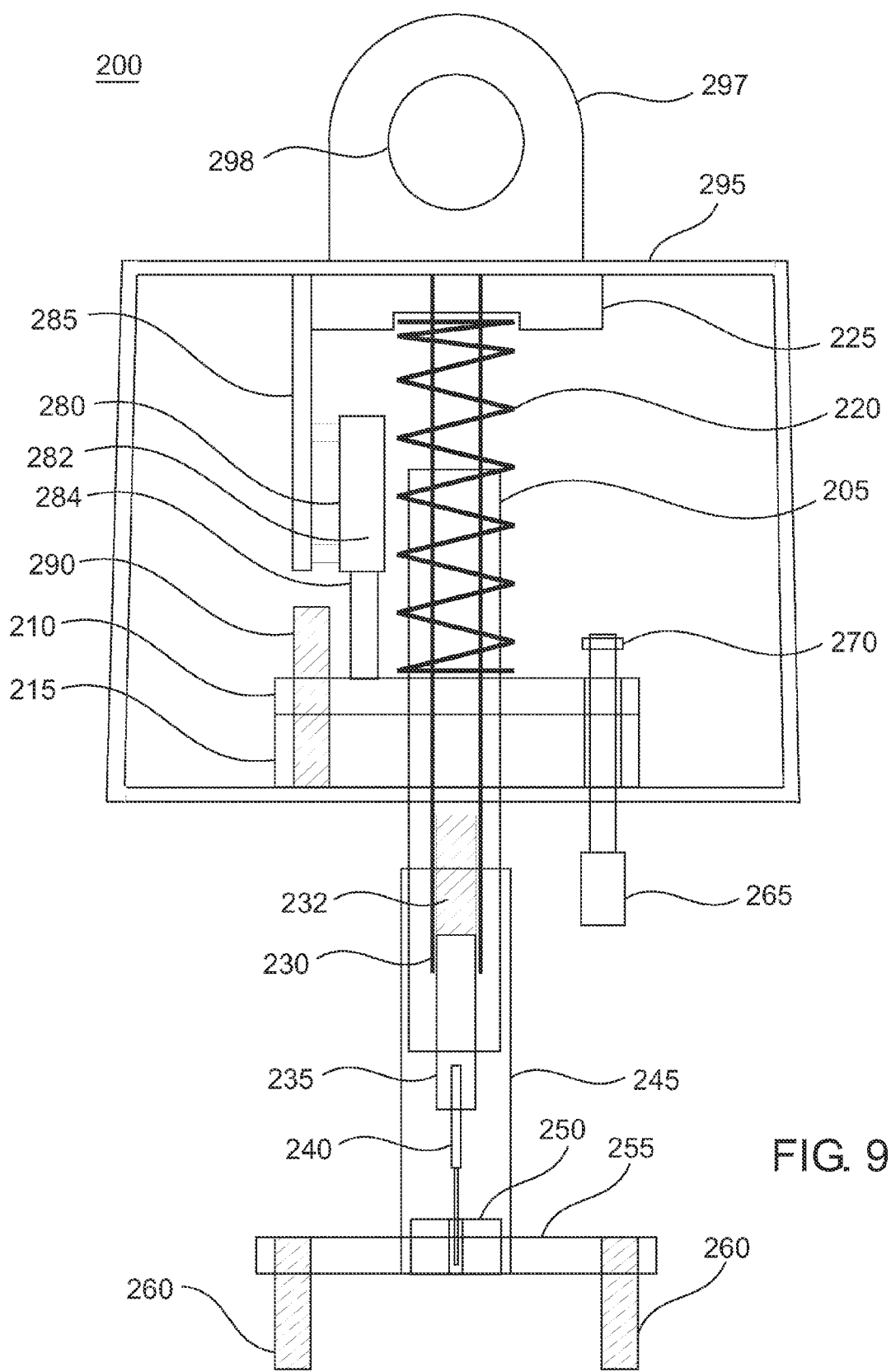
FIG. 9 illustrates an internal view of the URD probe.

FIG. 8 illustrates a perspective view of URD probe 200 (the apparatus of the current invention) being pressed downward against URD cable 20 to determine the energized status and phase of URD cable 20 in accordance with a preferred embodiment of the present invention. FIG. 9 illustrates an internal cross sectional view of URD probe 200.

Referring to FIG. 9, URD probe 200 enclosure 295 contains tube 205 which is rigidly affixed to tube stop 210. Tube 205 passes through tube guide 215 which is rigidly affixed to enclosure 295. Spring 220 applies pressure to tube stop 210 so as to press tube stop against tube guide 215. Spring 220 is held in place using spring guide 225 which is rigidly affixed to enclosure 295. Spring guide 225 also rigidly holds support rod 230 which in turn holds needle holder 235 which rigidly holds needle 240. Needle holder 235 optimally consists of a small drill chuck so that needle 240 can be easily replaced without tools.

Tube shroud 245 is attached to tube 205 to protect and shield needle holder 235 and needle 240. Shroud foot 255 is rigidly attached to tube shroud 245 and needle 240 passes through shroud plug 250 which is rigidly attached to tube shroud 245. Two shroud guide pins 260 are rigidly attached to shroud foot 255 to ensure URD cable 20 is centered under needle 240. When downward pressure is applied to enclosure 295 against a URD cable 20 placed under shroud foot 255, spring 220 compresses which causes shroud foot 255, shroud plug 250, tube shroud 245, tube stop 210, and tube 205 to move upward with respect to enclosure 295 while support rod 230, needle holder 235, and needle 240 remain stationary with respect to enclosure 295. This spring loaded mechanism causes needle 240 to protrude through shroud plug 250 and penetrate URD cable 20. Thus, the portion of needle 240 not penetrating URD cable 20 is protected and shielded.

Tube shroud 245 to tube 205 mechanical connection is designed to allow tube shroud 245 to be easily and conveniently removed in the field without the need for tools so as to expose needle 240 for easy replacement by workers if needle 240 is damaged. In the preferred implementation, a thumb screw (not shown) is used to affix tube shroud 245 to tube 205.

As illustrated in FIG. 8, URD probe 200 is pressed against URD cable 20. Shroud guide pins 260 are placed on opposite sides of URD cable 20 and URD probe 200 is lightly twisted so that shroud guide pins 260 are tight against each side of URD cable 20. This ensures that the center of URD cable 20 is aligned exactly under needle 240. Shroud guide pins 260 are spaced wider than the largest diameter URD cable 20 to be probed so URD probe 200 can be used on many different diameter URD cables 20.

Tube stop guidance pin 290 is rigidly affixed to tube guide 215 which ensures tube stop 210 remains aligned with tube guide 215 when URD probe 200 is lightly twisted. Tube stop 210 moves freely along tube stop guidance pin 290 as tube stop 210 moves vertically above tube guide 215 as URD probe 200 is pressed against URD cable 20.

Tube guide 215 is threaded for thumb screw 265 and tube stop 210 is clearance drilled for thumb screw 265. Nut 270 is rigidly affixed to the end of thumb screw 265 to limit the vertical movement of tube stop 210 above tube guide 215.

This forms a mechanical hard stop which limits the maximum protrusion of needle 240 through shroud plug 250 and thus the maximum penetration of needle 240 into URD cable 20.

Sensor support 285 is either rigidly attached directly to enclosure 295 or to spring guide 225 as illustrated in FIG. 9. Sensor 280 is composed of sensor body 282 and sensor shaft 284. Sensor body 282 is rigidly attached to sensor support 285 and spring loaded sensor shaft 284 contacts tube stop 210. Tube stop 210 moves vertically, as URD probe 200 is pressed against URD cable 20, which causes sensor shaft 284 to compress into sensor body 282 which varies sensor 280 resistance. This resistance change with tube stop 210 vertical movement implements an electronic needle 240 depth gauge which allows the operator to monitor the penetration of needle 240 into URD cable 20.

Grip 297 with hole 298 is rigidly attached to enclosure 295. Standard lineman "shotgun" insulated hot stick grip end 305 (in FIG. 8) is used to hold URD probe 200 in a safe manner and at a safe distance when URD probe 200 is being pressed against URD cable 20. FIG. 8 illustrates the position of shroud foot 255 and shroud guide pins 260 against URD cable 20. Digital display 325 monitors needle 240 penetration into URD cable 20. Short lamp 310 warns operator that needle 240 has contacted a neutral conductor 30 and URD probe 200 should be moved slightly to new position to avoid neutral conductor 30. Hot lamp 315 indicates URD cable 20 is energized. Pushbutton 320 is used to turn URD probe 200 on and off and to set digital display 325 needle 240 depth to zero prior to pressing URD probe 200 against URD cable 20. As digital display 325, short lamp 310, and hot lamp 315 are mounted on URD probe 200, all user displays are at a safe distance from the user.

URD probe 200 mechanical parts can be fabricated out of commonly available materials such as aluminum, stainless steel, and plastics. Enclosure 295, tube 205, and tube shroud 245 should be fabricated using metal materials so as to maximally shield needle 240 and preamp 232 from extraneous external electric fields. Shroud plug 250 should be fabricated from an insulating material such as plastic.

Figure 10:
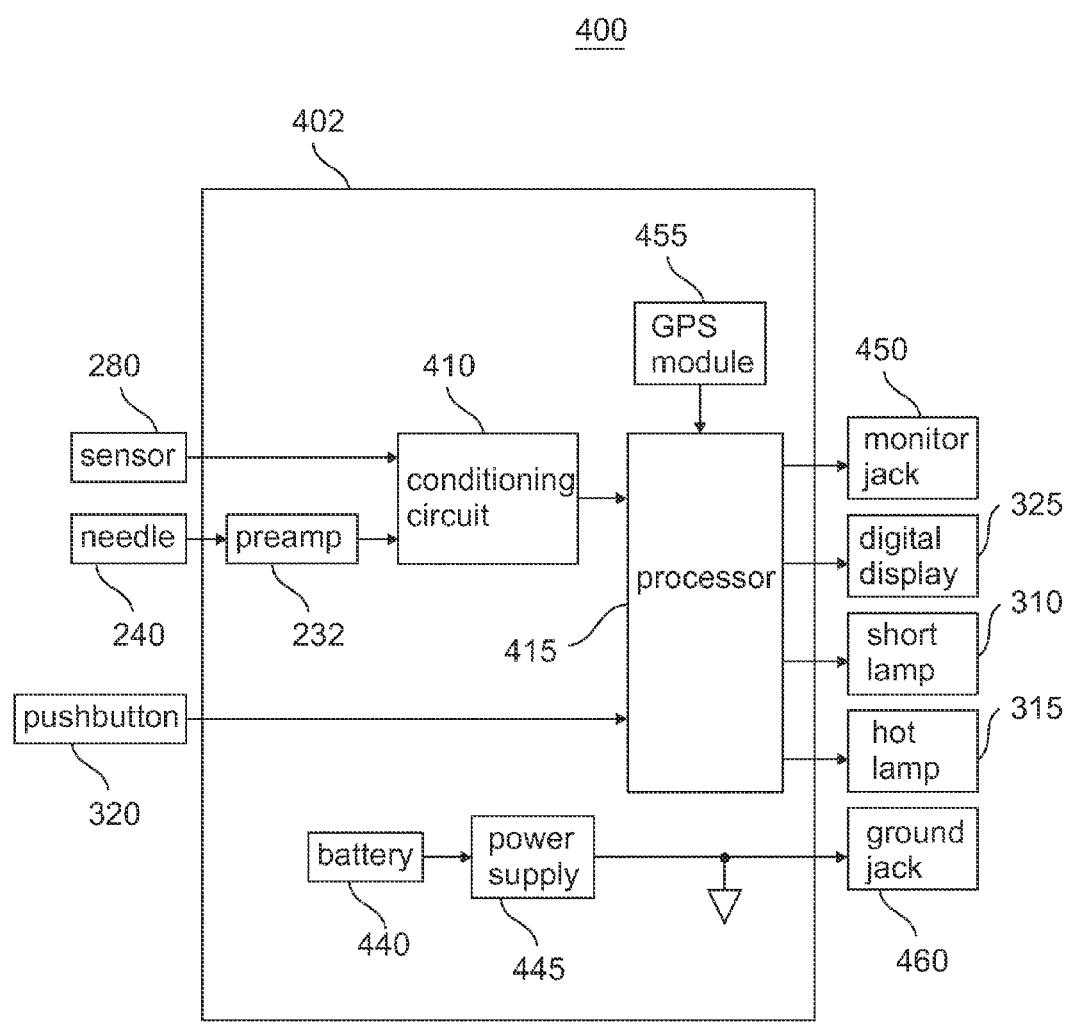
FIG. 10 illustrates an electrical block diagram of the URD probe.

FIG. 10 illustrates a block diagram 400 of URD probe 200 cable analysis circuit 402 coupled to needle 240 and sensor 280. This circuitry can be mounted at any convenient location in or on URD probe 200 such as on sensor support 285 or on enclosure 295.

Needle 240 is connected to preamp 232 which is most appropriately mounted inside support tube 230 close to needle holder 235 as illustrated in FIG. 9. Sensor 280 and preamp 232 are connected to conditioning circuit 410 which amplifies, buffers, and scales sensor 280 and preamp 232 outputs for processor 415. Processor 415 drives digital display 325, short lamp 310, and hot lamp 315.

Short lamp 310 illuminates when the resistance between needle 240 and ground falls below a predetermine value. This allows URD probe 200 to determine the quality of connection to URD cable 20 by detecting if needle 240 input signal capacitive coupled from center conductor 22 is being reduced due to an adversely low resistance to ground.

Hot lamp 315 illuminates when needle 240 line voltage exceeds a predetermined minimum value. When hot light 315 illuminates, digital display 325 alternately switches between needle 240 depth and needle 240 voltage appropriately scaled to display approximate URD cable 20 energized voltage. By monitoring both the actual needle 240 voltage and resistance, URD probe 200 actively determines status for both a live and a dead URD cable 20.

Pushbutton 320 turns URD probe 200 on/off and zeros displayed needle 240 depth when pressed. Battery 440 and power supply 445 supply power at the proper voltage and current levels for all URD probe 200 circuitry. Ground jack 460 is provided so a ground cable (not shown) can be connected to a convenient ground (including earth or dirt ground) when probing jacketed URD cable 20". A ground cable is optional when probing clean unjacketed URD cable 20' because shroud foot 255 provides a ground connection to neutral conductors 30.

GPS module 455 and monitor jack 450 are optional and allow URD probe 200 to determine URD cable 20 phase attribute if desired. Phase identification is fully described in U.S. Pat. No. 7,031,859. Monitor jack 450 allows needle 240 capacitive coupled line frequency signal from URD cable 20 center conductor 22 to be sent to external phase identification system equipment. Optionally, GPS module 455 can be incorporated into URD probe 200 and processor 415 appropriately programmed to measure instantaneous phase as described in U.S. Pat. No. 7,031,859.

Figure 11:
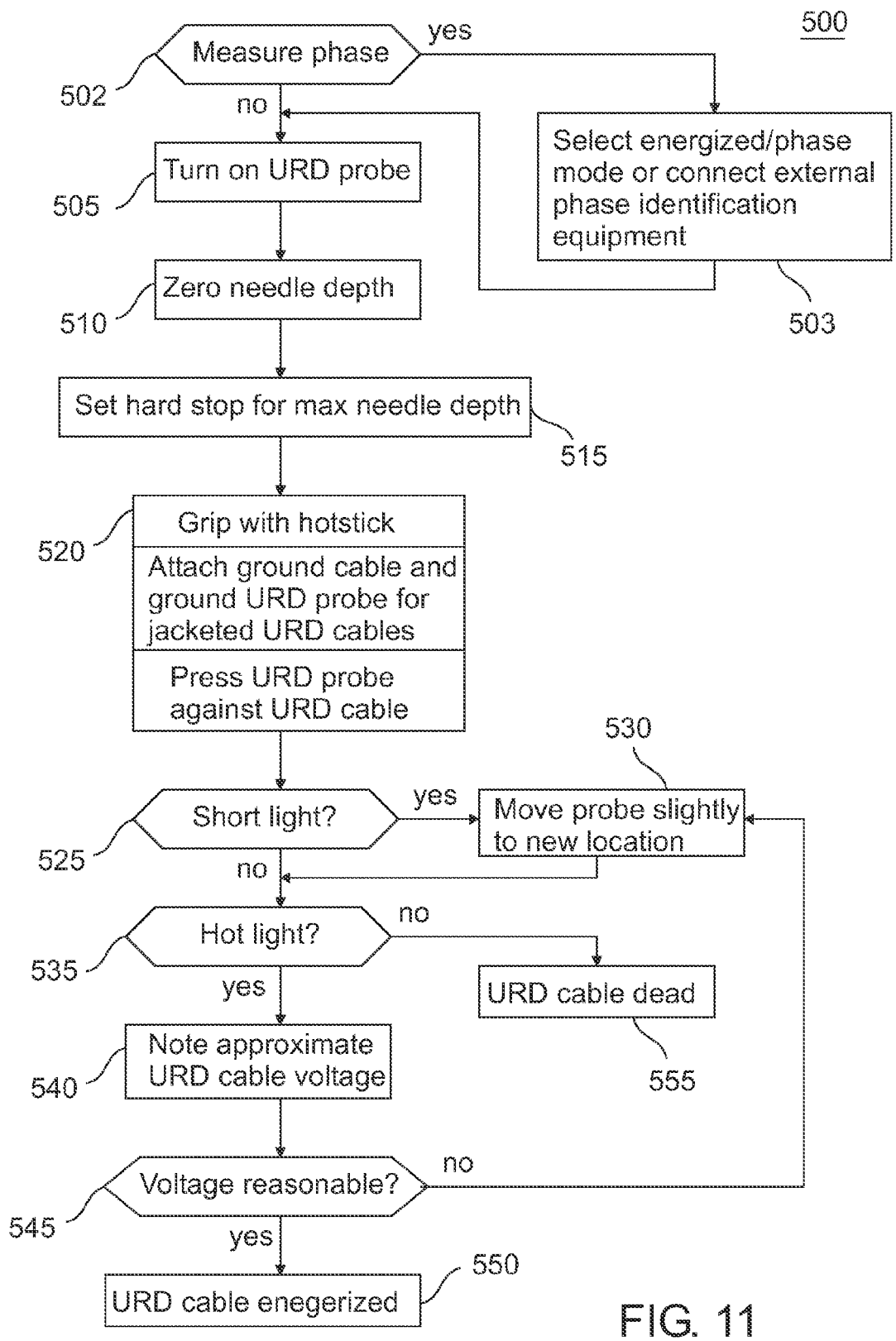
FIG. 11 illustrates a flow diagram of the steps used to apply the URD probe to a URD cable.

FIG. 11 illustrates a flow diagram 500 of the steps used to apply URD probe 200 to URD cable 20. The first step 502 is to decide if URD cable 20 phase attribute is to be determined in addition to the energized status. If so, step 503 is to select energized/phase mode if phase identification is incorporated into URD probe 200 or to connect external phase identification equipment to monitor jack 450. Monitor jack 450 can be mounted at any convenient location on URD probe 200 enclosure 295.

The next step 505 is to use the pushbutton 320 to turn on URD probe 200 followed by step 510 to zero needle 240 depth. Needle 240 depth is zeroed by hand compressing shroud foot 255 while observing needle 240 protrusion through shroud plug 250. When needle 240 is flush with the bottom of shroud foot 255, pushbutton 320 is momentarily pressed which sets needle 240 displayed depth on digital display 325 to zero.

The next step 515 is to adjust the mechanical hard stop so as to set the maximum needle 240 penetration depth into URD cable 20. Hard stop is set by turning thumb screw 265 to set the height of nut 270 above tube stop 210. Tube stop 210 cannot rise above tube guide 215 any further when tube stop 210 contacts nut 270. Each time thumb screw 265 is adjusted, the user hand compresses shroud foot 255 while monitoring needle 240 depth on digital display 325. Maximum depth is selected to be only slightly deeper than the expected thickness of jacket 32 plus outer semiconductor sheath 28. Setting the hard stop correctly prevents needle 240 from penetrating into insulation 26 by more than a few thousands of an inch.

The next step 520 is to grip URD probe 200 with hot stick grip end 305. For jacketed cables 20", plug in an appropriate ground cable (not shown) into URD probe 200 ground jack 460 and connect to any convenient ground reference. Simply connecting the ground cable to a screwdriver and poking it into the dirt is adequate. Slowly press URD probe 200 against URD cable 20 while monitoring needle 240 penetration depth on digital display 325. If short light 310 illuminates (step 525), it indicates that needle 240 has contacted a neutral conductor 30. Step 530 should then be executed whereby URD probe 200 is moved slightly along URD cable 20 and probed again. Since neutral conductors 30 are spiral wound, moving URD probe 200 just a quarter inch along the top of URD cable 20 is usually enough to clear neutral conductor 30 that was just contacted.

As needle 240 depth increases, step 535 is to watch for hot light 315 to illuminate. At this point, further penetration of needle 240 into URD cable 20 should be avoided by reducing downward pressure on the hot stick. When hot light 315 illuminates, digital display 325 alternately switches between needle 240 depth and needle 240 voltage appropriately scaled to display approximate URD cable 20 energized voltage which is noted in step 540. Displayed URD cable 20 voltage is not very precise because it is a function of needle 240 to center conductor 22 separation and to the length of needle 240 penetrating through outer semiconductor sheath 28. Its purpose is simply to present a rough voltage magnitude indication to the user. With experience on different types of cables, the user will learn if the displayed voltage is reasonable for the type cable being probed. If the voltage appears unreasonable, step 545 indicates URD probe 200 should be moved to a different location on URD cable 20 and probed again.

If displayed voltage appears reasonable, step 550 indicates that URD cable 20 is energized. If hot light 315 is not illuminated, and if the hard stop was set to ensure that needle 240 completely penetrated outer semiconductor sheath 28, then step 555 indicates URD cable 20 is dead (not energized).

Figure 12:
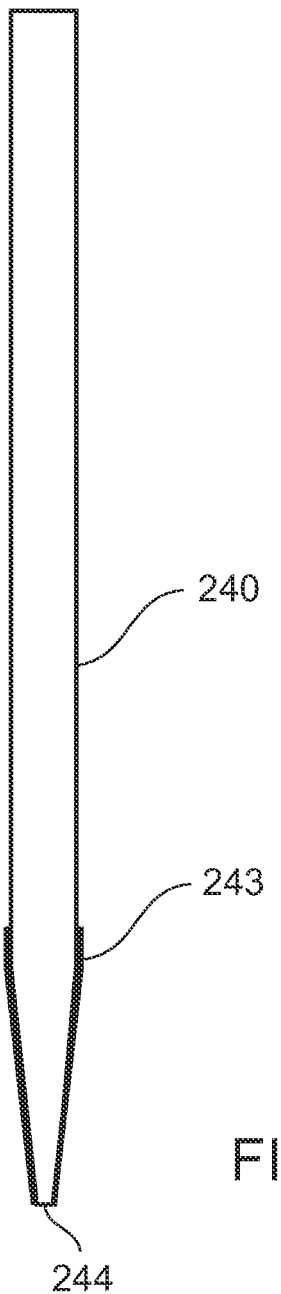
FIG. 12 illustrates the needle used to penetrate the URD cable.

Needle 240 is illustrated in FIG. 12. The portion of needle 240 that penetrates outer semiconductor sheath 28 should be covered with a high resistance insulation material 243 to prevent needle 240 from shorting to outer semiconductor sheath 28. Extreme needle 240 tip 244 should not be insulated to detect when needle 240 contacts a neutral conductor 30. Any appropriate high resistance insulation material 243 can be used. Only approximately the last half inch of needle 240 need be insulated but the entire needle 240, except for the extreme tip and the portion held by needle holder 235 can be insulated if desired. An example of a low cost insulated needle is a Teflon coated sewing machine needle.

Although URD probe 200 is designed to capacitive couple to URD cable 20 center conductor 22, it can also be used to determine the energized status of URD cable 20 by not penetrating outer semiconductor sheath 28 with needle 240 but instead measuring line signal $S_L$ across cable resistance R as described in U.S. Pat. No. 7,154,281. Using URD probe 200 in this manner would result in the same high incidence of false-dead results as the apparatus described in U.S. Pat. No. 7,154,281 but may have application in some circumstances where penetrating outer semiconductor sheath 28 cannot be tolerated.

In summary, status determination URD probe 200 is a probing device configured to engage URD cable 20 and determine the status thereof. The present invention teaches a URD probe 200 for determining the energized status and optionally the phase of an Underground Residential Distribution (URD) cable 20. URD probe 200 actively determines status for both a live and a dead URD cable 20. URD probe 200 determines status for both unjacketed and jacketed URD cables 20' and 20" respectively. URD probe 200 displays results viewable and instantly interpretable at a distance. URD probe 200 determines a quality of connection to URD cable 20 while determining the status thereof.

Grip 297 is a standardized hot stick adapter used in the industry to couple to a shotgun hot stick (grip end 305 only shown in FIG. 8), which is an insulated extension pole. The use of a hot stick allows URD probe 200 to be used at a distance from the worker, as in the bottom of a deep trench. This allows the worker to determine the status of a URD cable 20 safely and conveniently from outside the trench without necessitating direct manipulation of URD cable 20 by the worker. This significantly increases ease of use and overall safety.

The methodologies used to couple hot stick grip 297 to insulated shotgun hot stick grip end 305 are commonplace in the industry and well known to those of ordinary skill in the art. These methodologies are therefore not discussed herein.

Although the preferred embodiments of the invention have been illustrated and described in detail, it will be readily apparent to those skilled in the art that various modifications may be made therein without departing from the spirit of the invention or from the scope of the appended claims.

The described preferred implementation of URD probe 200 precisely monitors and controls needle 240 penetration into URD cable 20 to a depth that just penetrates outer semiconductor sheath 28 without penetrating insulator 26 by more than a few mils. However, other types of sensors, displays, hard stop, circuitry, and overall mechanical configurations can be used to accomplish the same function as the URD probe 200 implementation described in this patent disclosure.

What is claimed is:

1. A method of determining the energized status of URD cable in a power distribution network, said method comprising:
   providing a small diameter insulated needle;
   penetrating said URD cable outer semiconductor sheath with said needle;
   measuring depth of said penetration of said needle into said URD cable;
   communicating said depth to an operator as said operator penetrates said URD cable with said needle;
   providing an adjustable mechanical hard stop to prevent said needle penetration beyond a selected depth into said URD cable;
   measuring voltage on said needle; and
   determining said energized status of said URD cable from said voltage on said needle.

2. A method as claimed in claim 1 wherein said measuring comprises:
   shielding said needle from voltages outside said URD cable;
   amplifying voltage on said needle; and
   communicating said needle voltage to operator as said operator penetrates said URD cable with said needle.

3. A method as claimed in claim 1 wherein said determining comprises:
   measuring said needle resistance to ground;
   comparing said needle resistance to a predetermined resistance;
   comparing said needle voltage to a predetermined voltage;
   indicating said URD cable is energized when said needle resistance exceeds said predetermined resistance and said needle voltage exceeds said predetermined voltage; and
   indicating said URD cable not energized when said needle resistance exceeds said predetermined resistance and said needle voltage does not exceed said predetermined voltage.

4. A method as claimed in claim 3 additionally comprising:
   indicating said needle is touching a URD neutral conductor when said needle resistance does not exceed said predetermined resistance; and
   instructing operator to reposition said needle slightly on said URD cable and penetrate said URD cable again.

5. A method as claimed in claim 1 additionally comprising:
   implementing said needle in an enclosure that can be gripped with an insulated hot stick, thus allowing an operator to penetrate said URD cable with said needle at a safe distance from said URD cable;
   protecting and shielding said needle when said needle is not penetrating said URD cable; and
   protruding said needle from said shielding when said operator places said enclosure against said URD cable and applies downward pressure on said hot stick.

6. An apparatus for determining the energized status of URD cable in a power distribution network, said apparatus comprises:
- an URD probe whose enclosure is configured to be held with an insulated hot stick;
- an insulated needle held by said URD probe and configured to penetrate said URD cable outer semiconductor sheath;
- a depth gauge within said URD probe, said depth gauge configured to measure penetration of said needle into said URD cable; and
- a cable analysis circuit within said URD probe, said circuit configured to measure voltage on said needle, said energized status of said URD cable, and communicate said energized status of said URD cable to operator.

7. An apparatus as in claim 6 wherein said URD probe further comprises an adjustable mechanical hard stop, said hard stop configured to prevent over penetration of said needle into said URD cable.

8. An apparatus as in claim 6 wherein said URD probe further comprises a spring loaded mechanism, said mechanism configured to protect and shield portion of said needle not penetrating said URD cable as said needle penetrates said URD cable.

9. An apparatus as in claim 8 wherein said mechanism is configured to cause said needle to protrude from said shield and penetrate said URD cable as operator presses said URD probe against said URD cable.

10. An apparatus as in claim 6 wherein said URD probe further comprises a pair of guide pins, said guide pins separation slightly wider than diameter of said URD cable and configured so said guide pins are tight against each side of said URD cable as said URD probe is twisted, thus ensuring that center of said URD cable is aligned exactly under said needle prior to said needle penetration into said URD cable.

11. An apparatus as in claim 6 wherein said needle is held by a small drill chuck to allow easy no-tool replacement of said needle.

12. An apparatus as in claim 6 wherein said needle is a Teflon coated sewing machine needle.

13. An apparatus as in claim 6 wherein said URD probe further comprises circuitry to determine phase attribute of said URD cable from said voltage on said needle.

14. An apparatus as in claim 6 wherein said URD probe comprises:
- a display configured to alternately indicate said needle penetration depth into said URD cable and said voltage on said needle;
- a light to indicate when said voltage exceeds a predetermined value, thus indicating said URD cable is energized;
- a light to indicate when resistance of said needle with respect to ground is below a predetermined value, thus indicating said needle has contacted a neutral conductor; and
- a switch to zero said display of said needle penetration depth prior to penetration.

15. A method of determining the energized status of URD cable in a power distribution network, said method comprising:
- providing a URD probe containing a small diameter insulated needle;
- gripping said URD probe with a hot stick, grounding said URD probe, and pressing said URD probe against said URD cable;
- measuring said needle resistance to ground as said needle penetrates said URD cable;
- ceasing said needle penetration and moving to a different penetration location on said URD cable if said resistance is below a preset resistance value;
- measuring said needle penetration depth and ceasing said penetration if said depth exceeds a preset depth value;
- measuring said needle voltage as said needle penetrates outer semiconductor sheath;
- indicating said URD cable is energized if said resistance exceeds said preset resistance value and said voltage exceeds said preset voltage value; and
- indicating said URD cable is not energized if said resistance exceeds said preset resistance value and said voltage does not exceed said preset voltage value.

16. A method as claimed in claim 15 additionally comprises coupling said URD probe said needle voltage to a phase identification system to determine phase attribute of said URD cable.

* * * * *